United States Patent [19]

Voigt et al.

[11] 3,749,383

[45] July 31, 1973

[54] APPARATUS FOR PROCESSING SEMICONDUCTOR DEVICES

[75] Inventors: Edward Harold Voigt, Summit; William Bernard Hall, Stockton, both of N.J.

[73] Assignee: RCA Corporation, Princeton, N.J.

[22] Filed: Apr. 29, 1971

[21] Appl. No.: 138,632

[52] U.S. Cl. .................. 266/5 A, 148/175, 263/6 R

[51] Int. Cl. .............................................. C21d 1/06

[58] Field of Search .................... 266/5 R, 5 A, 5 B, 266/2 R; 263/6 R, 7 R; 148/175

[56] References Cited

UNITED STATES PATENTS 1,876,960 9/1932 Kenworthy.......................... 266/5 A

*Primary Examiner*—Gerald A. Dost

*Attorney*—Glenn H. Bruestle

[57] ABSTRACT

Apparatus for growing epitaxial layers of semiconductor material on substrate wafers at a relatively high production rate comprises a reactor furnace and a loading device cooperatively associated with it. An elevator is disposed to raise, and to lower, a holder for the wafers through an opening in the bottom of the heating chamber of the furnace. The loading device comprises an arm disposed for rotation on a carriage that is slidable towards and away from the elevator. The holder is adapted to be disposed on either end of the rotatable arm for delivery to, and for removal from, the furnace. When the loading device is disposed for movement between two furnaces, three wafer holders can be used for processing wafers at a high rate of production.

6 Claims, 4 Drawing Figures

INVENTORS.
William B. Hall and
Edward H. Voigt.
BY Arthur I. Spechler
ATTORNEY

INVENTORS.
William B. Hall and
Edward H. Voigt.
BY Arthur I. Spechler
ATTORNEY

INVENTORS.
William B. Hall and
Edward H. Voigt.
BY Arthur I. Spechler
ATTORNEY

APPARATUS FOR PROCESSING SEMICONDUCTOR DEVICES

BACKGROUND OF THE INVENTION

This invention relates to apparatus for processing semiconductor devices, and more particularly, to apparatus for growing epitaxial layers of semiconductor material on semiconductor wafers. The novel apparatus is particularly useful for depositing epitaxial layers of silicon on semiconductor wafers used in the manufacture of electronic integrated circuits.

In the mass production of electronic integrated circuits, it is often necessary to deposit an epitaxial layer of a semiconductor material, such as silicon, for example, on a substrate, such as a semiconductor wafer. It is also desirable to carry out this process in a manner to provide processed wafers with substantially uniform epitaxial layers thereon at as high a production rate as possible. It has been proposed to deposit epitaxial layers of semiconductor material on substrate wafers in a furnace wherein the substrate wafers were supported on a susceptor holder, but the loading of the susceptor holder, and the unloading of the heated susceptor holder with the substrate wafers thereon, presented a time consuming process that resulted in a relatively low production rate.

SUMMARY OF THE INVENTION

The novel apparatus comprises a furnace, having a heating chamber formed with an opening at the bottom thereof, elevator means for raising, and lowering, a holder for devices to be processed in the furnace, and a loading device cooperatively associated with the elevator means for loading the holder into, and unloading the holder from, the furnace.

In one embodiment of the novel apparatus, the loading device comprises an arm pivoted, intermediate its ends, for rotation on a carriage that is slidable towards and away from the elevator means. The arm is adapted to dispose a holder over the elevator means so that the elevator means may lift the holder off the arm and through the opening in the heating chamber.

In another embodiment of the novel apparatus, the loading device is disposed for movement between two furnaces so that one operator may service both furnaces sequentially, resulting in efficient processing and increased production.

DESCRIPTION OF THE PREFERRED EMBODIMENTS

Figure 1:
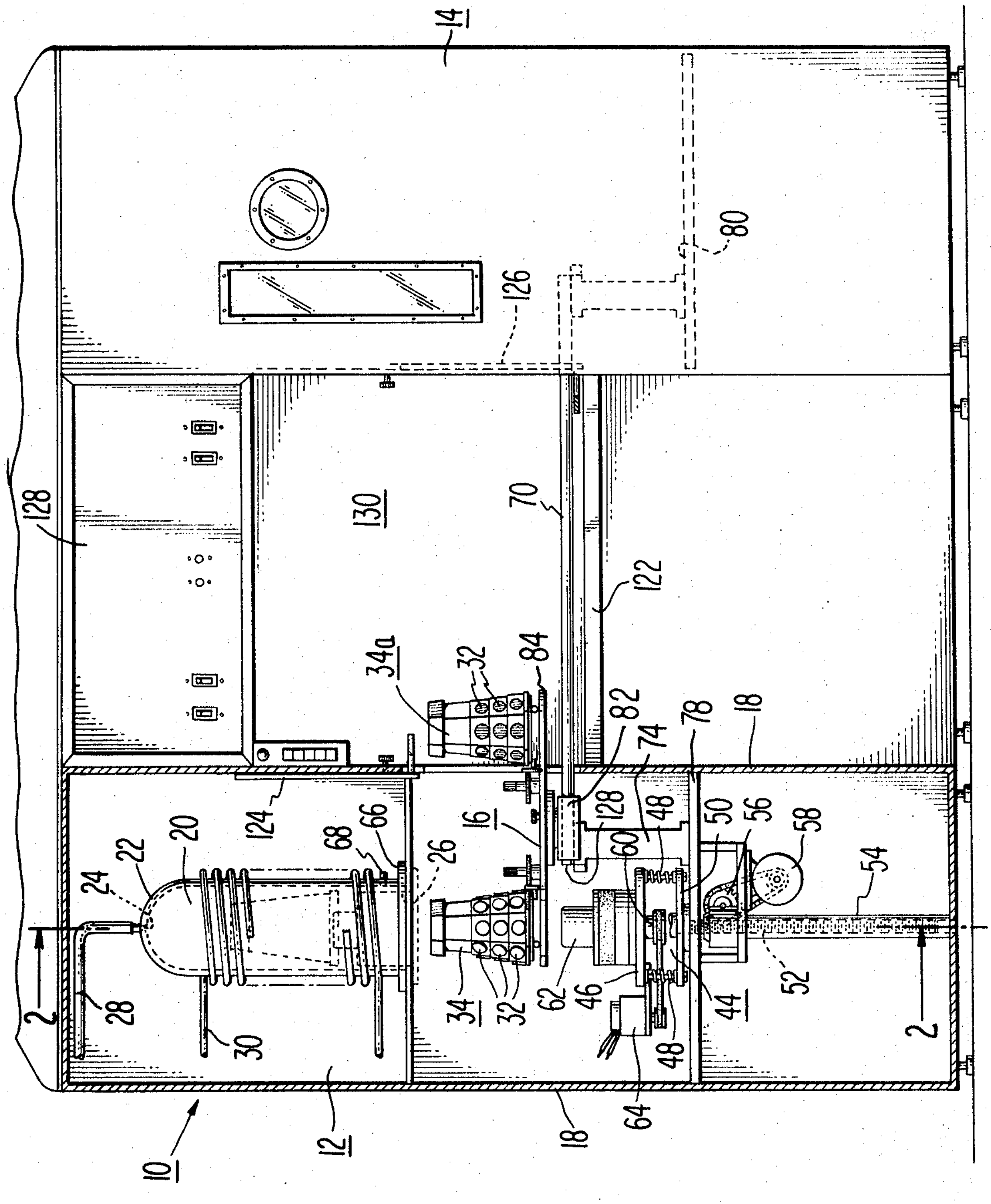
FIG. 1 is a front elevational view, with parts cut away, of the novel apparatus, showing two substrate wafer holders cooperatively associated between two furnaces.

Referring now to FIG. 1, there is shown novel apparatus 10 comprising two furnaces 12 and 14 and a loading device 16 cooperatively associated with them for loading and unloading the furnaces. The furnace 12 is substantially similar to the furnace 14, the former being constructed in a mirror image relationship to the latter. Hence, a description of the furnace 12 will also substantially describe the furnace 14.

The furnace 12 is a reactor-type furnace for the epitaxial deposition of a semiconductor material on a suitable substrate. The furnace 12 comprises a housing 18 having a heating chamber 20 disposed in the upper portion of the housing 18. The heating chamber 20 comprises a transparent quartz bell jar 22 formed with a small opening 24 at the top thereof and a larger opening 26 at the bottom thereof. The upper opening 24 communicates with a tube 28 for introducing gases into the chamber 20. Materials to be heat treated within the chamber 20 are introduced into the chamber 20 through the large lower opening 26. A coil 30 of electrically conductive material surrounds the bell jar 22 and is adapted to be connected to a suitable rf (radio frequency) generator (not shown) for inductively heating electrically conductive materials introduced in the heating chamber 20, in a manner known in the inductive heating art.

Figure 2:
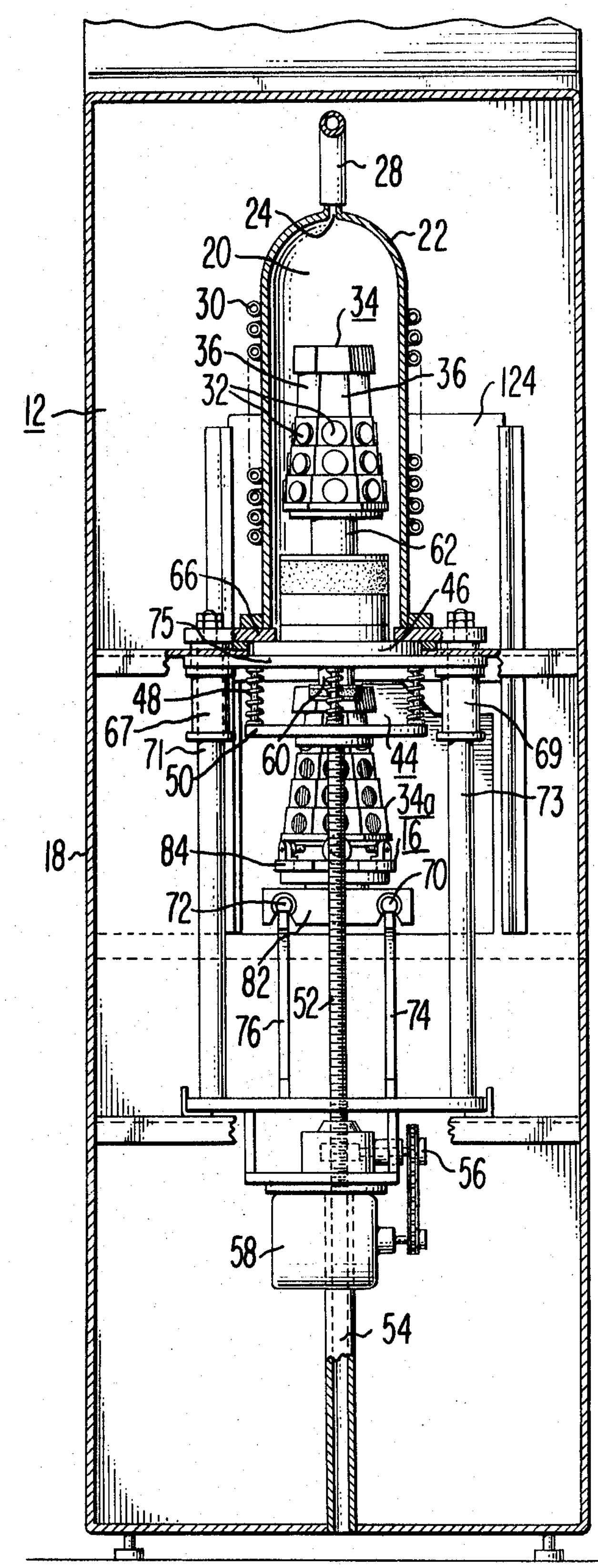
FIG. 2 is a fragmentary, cross-sectional view of one of the furnaces shown in FIG. 1, taken along the line 2—2, and viewed in the direction indicated by the arrows.
Figure 3:
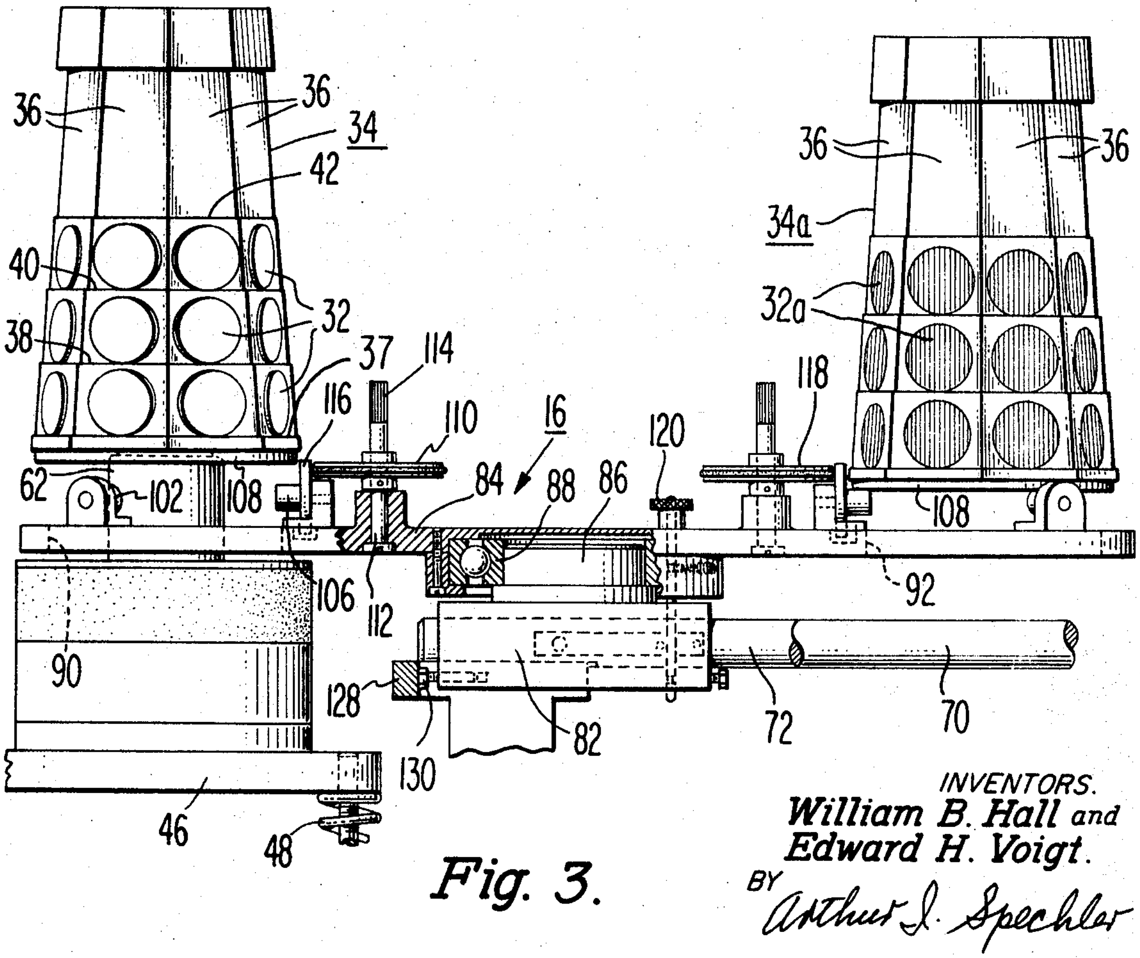
FIG. 3 is a fragmentary front elevational view of the loading device, with parts broken away, showing one wafer holder, without wafers, disposed on one end of the arm of the loading device and another wafer holder, loaded with wafers, lifted from the arm by an elevator of the furnace.

The apparatus 10 will be described for use in a process of depositing epitaxial layers of silicon on silicon substrate wafers 32 supported on a workpiece, such as a holder 34 in the form of a susceptor block, as shown in FIGS. 1 and 2, for example. The holder 34 is a truncated, hollow, pyramidal, graphite block having a plurality of planer walls 36 and ledges 37, 38, 40 and 42, for example, for supporting the substrate wafers 32 edgewise on the ledges, one large surface of each of the wafers 32 resting against one of the walls 36, as illustrated in FIG. 3. Since the graphite holder 34 and the wafers 32 are electrically conductive, they can be heated in the heating chamber 20 by the rf coil 30 when the latter is suitably energized. A holder 34*a*, illustrated in FIG. 3, is unloaded, but it shows markings 32*a* where wafers 32 were previously disposed for processing in the furnace. The markings 32*a* are darkened areas on the planar walls 36 resulting from the process of coating the wafers 32 with an epitaxial layer of silicon, as will be hereinafter described.

Elevator means are provided to raise and lower the holder 34, with the substrate wafers 32 disposed thereon, through the lower opening 26 of the heating chamber 20. To this end, an elevator 44 comprises a platform 46 mounted by springs 48 to a plate 50 which, in turn, is fixed to a circular rack 52. The vertical circular rack 52 is adapted to slide in a tube 54 and to be moved up and down by the rotation of a pinion gear 56 coupled to a reversible electric motor 58, the latter being fixed to a suitable support within the furnace and connected to any suitable source of electricity. A shaft 60 extends vertically through the platform 46, and the upper end of the shaft 60 is fixed to a block of insulating material including a hollow quartz cylinder 62. The lower end of the shaft 60 is coupled to an electric motor 64 for rotating the shaft 60 for the purpose hereinafter appearing. The motor 64 is fixed to the underside of the platform 46 for movement therewith. Thus, the elevator 44 can be raised and lowered by the reversible motor 58, and the quartz cylinder 62 can be rotated about its axis by the motor 64. The elevator 44 can be raised to a position where the platform 46 abuts a lower flange 66 of the bell jar 22 to seal the heating chamber 20. When so sealed, gases flowing into the chamber 20, through the openings 24 in the bell jar 22, can be exhausted through a tube 68 that extends from the lower part of the chamber 20. The exhaust gases are collected through suitable conduits (not shown) communicating with the tube 68.

The platform 46 is maintained in a horizontal position by means including sleeves 67 and 69 which slide on vertical guide rails 71 and 73, respectively. The sleeves 67 and 69 are fixed to a member 75 which, in turn, is fixed to the bottom of the platform 46.

Means are provided to load the furnace 12 with the holder 34, loaded with wafers 32. To this end, the loading device 16 is adapted to slide on a pair of parallel rails 70 and 72 disposed between the furnaces 12 and 14, as shown in FIGS. 1 and 2. The ends of the rails 70 and 72 adjacent the furnace 12 are supported by brackets 74 and 76, respectively, the latter brackets being fixed to, and extending from, a horizontal support 78 within the furnace 12. The ends of the parallel rails 70 and 72 adjacent the furnace 14 extend into the furnace 14 and are similarly supported by brackets that extend from a horizontal support 80 in the furnace 14, as shown in FIG. 1.

Figure 4:
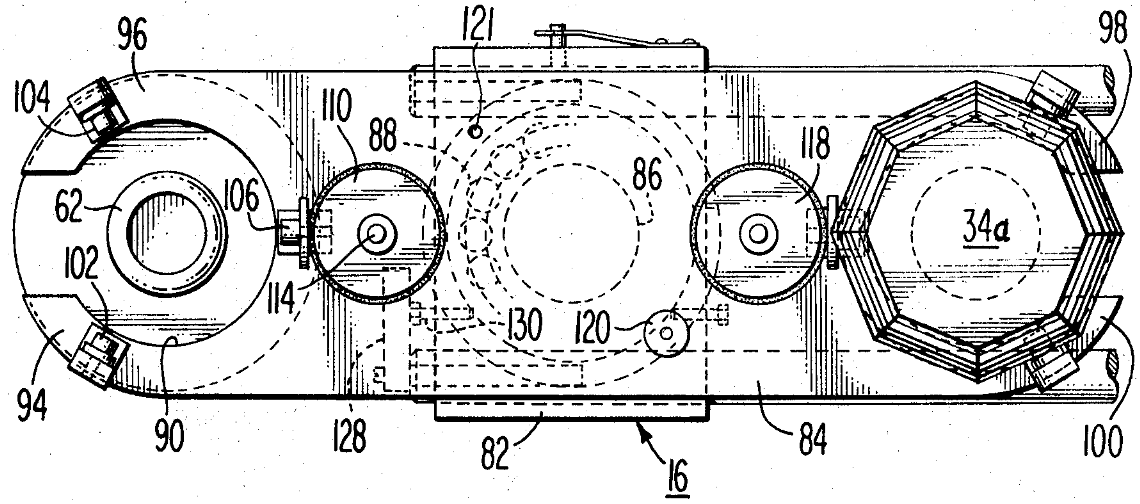
FIG. 4 is a plan view of the loading device, showing only one wafer holder disposed thereon.

Referring now to FIGS. 3 and 4, the loading device 16 is shown in detail. The loading device 16 comprises a carriage 82 disposed for slidable movement in a horizontal direction along the rails 70 and 72 between the furnaces 12 and 14. An elongated arm 84 is pivoted, intermediate its opposite ends, for horizontal rotation about a pivot 86 extending upwardly from the carriage 82. The arm 84 is coupled to the pivot 86 through a roller bearing 88. Thus, the arm 84 is rotatable in a horizontal plane about the pivot 86 above the carriage 82.

The arm 84 is formed with a separate cut-out portion 90 and 92 at each of its opposite ends, respectively, for the puspose hereinafter appearing. The cut-out portion 90 is in the form of a slot in one end of the arm 84 and is defined by separated fingers 94 and 96 that extend outwardly from the arm 84. The cut-out portion 92 is defined in part by separated fingers 98 and 100.

Means are provided to support the holders 34 on the ends of the arm 84 so that they may be rotated about their vertical axes for ease in loading the substrate wafers 32 onto the holders 34, and for unloading processed wafers 32 from very hot holders 34. To this end, a plurality of rollers 102, 104, and 106 are mounted on the upper surface of the arm 84, adjacent the cut-out portion 90, by suitable brackets, as shown in FIGS. 3 and 4. The rollers 102, 104, and 106 are disposed so that a round plate 108 at the bottom of the holder 34 can rest on the rollers, as shown particularly in FIG. 3 by holder 34*a*. A horizontally disposed wheel 110, having an o-ring fixed to its periphery, is fixed to a shaft 112 whose lower end is journaled in the arm 84, and whose upper portion 114 is knurled for rotating the wheel 110 by a twisting action of the thumb and forefinger of the hand. The o-ring of the wheel 110 is disposed against a vertical flange 116 of the roller 106 for rotating the roller 106 when the wheel 110 is rotated. Thus, the holder 34 can be rotated about its vertical axis by twisting the knurled portion 114 of the shaft 112 and rotating the wheel 110.

A wheel 118, similar to the wheel 110, is disposed adjacent one of the rollers on the other end of the arm 84 for rotating the holder 34*a*, each of the opposite ends of the arm 84 being similar in construction and having similar rollers. The wheels 110 and 118 make it easy for an operator to unload wafers from a heated holder 34 without touching the holder 34, since the holder 34 is very hot when it is removed from the furnace. The wheels 110 and 118 not only make it possible for an operator to manipulate even the hotest of holders 34 so that the wafers 32 may be removed with suitable tweezers but also makes it easy to load substrate wafers 32 onto the holders 34 for processing.

It is necessary for the arm 84 to be fixed in a parallel relationship with respect to the rails 70 and 72 when a holder 34 is to be moved toward a furnace for loading the furnace. Hence, a removable vertical pin 120 is disposed through suitably disposed holes in the arm 84 and in the carriage 82 to fix the arm 84 in a parallel position with respect to the rails 70 and 72, as shown in FIG. 3. The arm 84 may be rotated 180° and fixed in that position by the pin 120, utilizing a hold 121 in the arm 84.

The furnace 12 is joined to the furnace 14 by a table shelf 122, disposed below the rails 70 and 72, as shown in FIG. 1. The table shelf 122 provides a surface upon which an operator can work to load wafers 32 on, and unload them from, the holder 34.

The furnace 12 has a sliding door 124 which is slidable upwardly in a vertical plane against the housing 18 for providing an opening through which the loading device 16 can pass. The furnace 14 is also provided with a sliding door 126, slidable in a vertical plane against the vertical portion of its housing, for providing an opening for the loading device 16. Each of the sliding doors 124 and 126 is provided with a suitable latch to fix it in an open position when so desired.

The furnaces 12 and 14 are also separated by suitable electrical circuits and controls disposed in a compartment 128 between the furnaces 12 and 14. The space 130 between the compartment 128 and table shelf 122 is utilized for loading the wafers 32 onto, and unloading them from, the holders 34 by an operator.

The cooperation of the loading device 16 with the furnace 12 will now be explained in a process for coating the substrate wafers 32 of silicon with an epitaxial layer of silicon, a process well known in the semiconductor manufacturing art. The elevator 44 is lowered, via motor 58, gear 56, and rack 52 to its lowest position, as shown in FIG. 1. A holder 34, loaded previously in the space 130 with wafers 32, is disposed on the rollers 102, 104, and 106 of the arm 84. The door 124 is opened, suitably latched, and the carriage 82 is slid along the rails 70 and 72 until the holder 34 is disposed over the quartz cylinder 62 on the elevator 44. The exact position for disposing the holder 34 axially over the axis of the cylinder 62 is determined by a stop 128 against which an adjustable screw 130 on the carriage abuts, as shown in FIG. 3.

The motor 58 is energized to raise the elevator 44 until a portion of the cylinder 62 passes through the cut-out portion 90 in the arm 84 and lifts the holder 34 from the rollers 102, 104, and 106, as shown by the holder 34 in FIG. 3. The loading device 16 is now retracted into the space 130 and the door 124 is closed.

Next, the holder 34 is raised further, by the elevator 44, into the heating chamber 20 until the platform 46 abuts the flange 66. The holder 34 mounted on the platform 46 is shown in phantom within the bell jar 22 in FIG. 1. The rf coil 30 is now energized for a source of suitable rf energy and the graphite holder 34 and wafers 32 thereon are heated inductively to a desired temperature, say about 1200°C. Gases, such as silicon tetrachloride and hydrogen are now introduced, through the tube 28 from a suitable source (not shown), into the chamber 20 where the silicon tetrachloride is reduced by the hydrogen and silicon is deposited epitaxially into the wafers 32. The motor 64 is suitably energized to rotate the cylinder 62 which, in turn, rotates the holder 34 so that the wafers 32 receive a uniform deposit of the epitaxial layer of silicon. The gaseous products of the reaction are removed from the heating chamber 20 through suitable means connected to the exhaust tube 68.

After a desired thickness of the epitaxial layers of silicon have been deposited on the wafers 32, the gases to the heating chamber 20 are shut off and the rf energy is cut off from the rf coil 30. The processed wafers 32 are now removed by lowering the elevator 44, to the position shown by the holder 34 in FIG. 3. The door 124 is opened and the loading device 16 is moved into the furnace 12 to the position shown in FIG. 3. The elevator 44 is lowered to the position shown in FIG. 1 so that the holder 34 rests on the rollers 102, 104, and 106; and the holder 34 is removed from the elevator 44. The loading device 16, with the holder 34 thereon, is now retracted from the oven 12 into the area 130.

Before the processed wafers 32 are removed from the hot holder 34, a second holder 34, fully loaded with wafers 32, is disposed on an opposite end of the arm 84. By removing the pin 120, rotating the arm 84 180°, and inserting the pin 120 through the hole 121, the previously prepared second holder 34 can be positioned for insertion into the furnace 12, in the manner previously described. The second previously prepared loaded holder 34 is inserted into the furnace 12 even before the hot processed holder 34 is unloaded.

Thus, while one holder 34 is being processed in the furnace 12, a second holder 34 can be loaded with wafers 32 on the table shelf 122. When the processing of the first holder 34 is completed, it is lowered onto the arm 84 of the loading device 16. The processed holder 34 is then removed from the furnace 12 and the second, previously prepared, holder 34 is inserted and raised into the heating chamber 20 for another process run. While the second holder 34 is being processed, the first holder 34 is unloaded and then reloaded with new wafers 32. The reloaded holder 34 can be processed in the furnace 14 in a manner similar to the processing of the holder 34 in the furnace 12. In this manner three holders 34 can be used to maintain the epitaxial process in both of the furnaces 12 and 14, a separate holder 34, being in each of the furnaces 12 and 14 and one holder 34 being on the table shelf 122 which can be unloaded and reloaded for another process run.

We claim:

1. Apparatus comprising:
a furnace having a heating chamber formed with an opening at the bottom thereof,
elevator means disposed beneath said opening of said chamber for raising and lowering a workpiece through said opening,
a carriage,
means to dispose said carriage for movement toward and away from said elevator means,
an arm pivoted, intermediate its ends, for rotation on said carriage, said arm being formed with a separate cut-out portion at each of said ends thereof,
each of said cut-out portions being defined by two separated fingers extending from each end of said arm, and
means including said two of said separated fingers for supporting said workpiece over one of said cut-out portions, so that said carriage can be moved to dispose said cut-out portion of said arm over said elevator means and said elevator means can lift said workpiece from said fingers through said opening in said furnace, and lower said workpiece through said opening onto said fingers after said workpiece has been heat treated a desired time.

2. The apparatus of claim 1, wherein
said elevator means comprise means to seal said opening when said elevator is in the raised position.

3. The apparatus of claim 2, wherein
means are cooperatively associated with said elevator means for rotating said workpiece when said workpiece is in said chamber.

4. The apparatus of claim 1, wherein
said means to dispose said carriage for movement comprises at least one rail, said carriage being slidable on said rail, and
a table shelf is disposed beneath said carriage.

5. The apparatus of claim 1, wherein
said arm is rotatable in a horizontal plane, and
said means for supporting said workpiece comprise a plurality of rollers fixed to said fingers and said arm adjacent each of said cut-out portions, said workpiece being adapted to rest on said rollers, and
rotatable means, having a shaft disposed for rotation in said arm, are coupled to one of said rollers for rotating said one roller, whereby to rotate said workpiece on said rollers.

6. In apparatus of the type for processing semiconductor wafers comprising two spaced-apart substantially similar furnaces connected by the same loading and unloading means, the improvement comprising:
a separate housing for each furnace,
each of said furnaces having a heating chamber disposed in the upper portion of each housing, each chamber being formed with an opening at the bottom thereof,
separate elevator means disposed in the lower portion of each housing beneath the opening of each of said chambers for raising and lowering a susceptor block through the opening, said susceptor block being formed with ridges and said wafers being supported edgewise on said ridges,
said loading and unloading means comprising:
a carriage
means to dispose said carriage for movement between both of said elevator means,
an arm pivoted, intermediate its ends, for rotation on said carriage, said arm being formed with a separate cut-out portion at each of said ends thereof,
each of said cut-out portions being defined by two separated fingers extending from each end of said arm, and means including said fingers for supporting a separate susceptor block over each of said cut-out portions, whereby said carriage may be moved to dispose either of said cut-out portions of said arm over either of said elevator means so that the selected elevator means can lift the susceptor block off said fingers through the opening in the selected one of said furnaces, and lower said susceptor block through the opening and onto said fingers.

* * * * *

UNITED STATES PATENT OFFICE
CERTIFICATE OF CORRECTION

Patent No. 3,749,383 Dated 7-31-73

Inventor(s) Edward Harold Voigt and William Bernard Hall

It is certified that error appears in the above-identified patent and that said Letters Patent are hereby corrected as shown below:

Claim 1 should read:

1. In apparatus of the type comprising a furnace having a heating chamber formed with an opening at the bottom thereof, and elevator means disposed beneath said opening of said chamber for raising and lowering a workpiece through said opening, the improvement comprising:

a carriage, means to dispose said carriage for movement toward and away from said elevator means, an arm pivoted, intermediate its ends, for rotation on said carriage, said arm being formed with a separate cut-out portion at each of said ends thereof, each of said cut-out portions being defined by two separated fingers extending from each end of said arm, and means including said two of said separated fingers for supporting said workpiece over one of said cut-out portions, so that said carriage can be moved to dispose said cut-out portion of said arm over said elevator means and said elevator means can lift said workpiece from said fingers through said opening in said furnace, and lower said workpiece through said opening onto said fingers after said workpiece has been heat treated a desired time.

Claim 2 should read:

2. In apparatus of the type described in Claim 1, said elevator means comprise means to seal said opening when said elevator is in the raised position.

ORM PO-1050 (10-69)
530 6|72

USCOMM-DC 60376-P69
☆ U.S. GOVERNMENT PRINTING OFFICE 1969 O—366-334

UNITED STATES PATENT OFFICE

CERTIFICATE OF CORRECTION

Patent No. 3,749,383 Dated 7-31-73

Inventor(s) Edward Harold Voigt & William Bernard Hall

It is certified that error appears in the above-identified patent and that said Letters Patent are hereby corrected as shown below:

Claim 3 should read:

3. In apparatus of the type described in Claim 2, means are cooperatively associated with said elevator means for rotating said workpiece when said workpiece is in said chamber.

Claim 4 should read:

4. In apparatus of the type described in Claim 1, said means to dispose said carriage for movement comprises at least one rail, said carriage being slidable on said rail, and
a table shelf is disposed beneath said carriage.

Claim 5 should read:

5. In apparatus of the type described in Claim 1, said arm is rotatable in a horizontal plane, and
said means for supporting said workpiece comprise a plurality of rollers fixed to said fingers and said arm adjacent each of said cut-out portions, said workpiece being adapted to rest on said rollers, and
rotatable means, having a shaft disposed for rotation in said arm, are coupled to one of said rollers for rotating said one roller, whereby to rotate said workpiece on said rollers.

(continued)

FORM PO-1050 (10-69)
1530 6/72
USCOMM-DC 60376-P69
☆ U.S. GOVERNMENT PRINTING OFFICE : 1969 O—366-334

UNITED STATES PATENT OFFICE
CERTIFICATE OF CORRECTION

Patent No. 3,749,383 Dated 7-31-73

Inventor(s) Edward Harold Voigt & William Bernard Hall

It is certified that error appears in the above-identified patent and that said Letters Patent are hereby corrected as shown below:

Claim 6 should read:

6. In apparatus of the type for processing semiconductor wafers comprising two spaced-apart substantially similar furnaces, a separate housing for each furnace, each of said furnaces having a heating chamber disposed in the upper portion of each housing, each chamber being formed with an opening at the bottom thereof, and separate elevator means disposed in the lower portion of each housing beneath the opening of each of said chambers for raising and lowering a susceptor block through the opening, said susceptor block being formed with ridges and said wafers being supported edgewise on said ridges, the improvement comprising:

loading and unloading means disposed between said two furnaces and comprising a carriage, means to dispose said carriage for movement between both of said elevator means, an arm pivoted, intermediate its ends, for rotation on said carriage, said arm being formed with a separate cut-out portion at each of said ends thereof, each of said cut-out portions being defined by two separated fingers extending from each end of said arm, and means including said fingers for supporting a separate susceptor block over each of said cut-out portions, whereby said carriage may be moved to dispose either of said cut-out portions of said arm over either of said elevator means so that the selected elevator means can lift the susceptor block off said fingers through the opening in the selected one of said furnaces, and lower said susceptor block through the opening and onto said fingers.

Signed and sealed this 20th day of November 1973.

(SEAL)
Attest:

EDWARD M.FLETCHER,JR.
Attesting Officer

RENE D. TEGTMEYER
Acting Commissioner of Patents

FORM PO-1050 (10-69)
3530 6|72

USCOMM-DC 60376-P69
☆ U.S. GOVERNMENT PRINTING OFFICE : 1969 O—366-334